United States Patent [19]

Wu

[11] Patent Number: 4,697,087
[45] Date of Patent: Sep. 29, 1987

[54] REVERSE DARK FIELD ALIGNMENT SYSTEM FOR SCANNING LITHOGRAPHIC ALIGNER

[75] Inventor: Frederick Y. Wu, Cos Cob, Conn.

[73] Assignee: The Perkin-Elmer Corporation, Norwalk, Conn.

[21] Appl. No.: 868,506

[22] Filed: Jul. 31, 1986

[51] Int. Cl.⁴ .................. G01V 9/04; G01B 11/27
[52] U.S. Cl. ........................ 250/548; 356/401; 364/559
[58] Field of Search ............ 250/548, 557, 561; 356/309, 400, 401; 364/490, 491, 559

[56] References Cited

U.S. PATENT DOCUMENTS

| | | | |
|---|---|---|---|
| 4,167,677 | 9/1979 | Suzki | 250/548 |
| 4,202,627 | 5/1980 | Suzki et al. | 250/548 |
| 4,553,845 | 11/1985 | Kuroki et al. | 356/401 |

Primary Examiner—Edward P. Westin
Assistant Examiner—Jessica L. Ruoff
Attorney, Agent, or Firm—Richard C. Wilder; Thomas P. Murphy; Edwin T. Grimes

[57] ABSTRACT

An alignment apparatus wherein a wafer having a wafer target thereon and a reticle having a reticle target therethrough are aligned to each other. An alignment image is formed on the wafer, and the wafer and reticle are scanned relative to the alignment image. The alignment image has a linear extent normal to the scanning direction which is longer than the wafer target so that a portion of the alignment image is reflected by the wafer. The portion of the alignment image reflected by the wafer is reimaged onto the reticle target. Collecting optics are provided to collect light from the alignment image that is backscattered by the wafer target as the wafer target is scanned past the alignment image. Two detectors are provided: one to detect the backscattered light, the other to detect light which passes through the reticle target. The output from each of the detectors is compared to determine any misalignment.

22 Claims, 8 Drawing Figures

REVERSE DARK FIELD ALIGNMENT SYSTEM FOR SCANNING LITHOGRAPHIC ALIGNER

FIELD OF THE INVENTION

The present invention relates to photolithography systems in general and, more particularly, to such systems wherein reticle-to-wafer alignment is achieved automatically.

BACKGROUND OF THE INVENTION

In the making of micro-circuits the general process followed is that of generating an oxide film on the semi-conductor substrate; coating the oxide film with a photoresist and then exposing the photoresist, through a mask, to radiation. The mask has a pattern of opaque or transparent portions thereon. After exposure, the photoresist is developed creating a pattern of exposed or unexposed portions corresponding to the pattern of transparent or opaque portions of the mask.

The photoresist that remains after developing forms a protective cover for the oxide layer. The exposed portion of the oxide layer is then etched to expose portions of the substrate layer below it. Impurities can then be doped into the substrate to give it electrical properties characteristic of the particular dopant/substrate combination created. Once done, the process may be repeated a number of times with additional oxide films formed, more resist deposited, the resist exposed, developed, and the oxide film etched with further steps of doping or depositing carried out.

Separate masks may be used for each of the successive exposure steps. If circuit elements in successive layers are to be properly aligned or registered with each other a high degree of alignment must be maintained between layers.

Almost all of the current automatic alignment systems require that the mask and wafer be essentially fixed with respect to the alignment system during the alignment process. This is no problem in a step-and-repeat type system, but is far from ideal in a step-and-scan projection printer as used in the present invention since misregistration can occur when the mask and wafer move with respect to each other and with respect to the projection system.

A promising approach to automatic wafer-to-reticle alignment is offered by the dark-field alignment concept. It was recognized early in the development of automatic wafer-to-reticle alignment systems that the only reliable system capable of working with complex topographies, covered with photoresist, had to be based on dark field imaging. This concept, generally, calls for alignment marks, or wafer targets, on the wafer to be illuminated by an alignment illumination source. Light from the alignment illumination source typically floods the wafer surface and is backscattered by edges of the wafer target and reflected by the wafer target itself. The intensity and position of backscattered radiation is detected and compared with the position of alignment features on the reticle to determine the degree of alignment or misalignment between the mask and reticle.

While a number of different types of dark-field wafer-to-reticle alignment systems have been provided in the prior art, and operate with moderate success, the reverse dark-field system is an improvement over such prior art dark-field systems. The improvement of the reverse dark-field alignment system over the prior art dark-field system is expected because the method has inherently lower background light levels, is less dependent on the quality of the light collection optics, and because symmetrical illumination can easily be achieved. A reverse dark-field system is also less susceptible to process induced variations of target profiles.

Early applications of the reverse dark-field concept to wafer-to-reticle alignment were found in step-and-repeat photolithography systems. See, e.g., R. S. Hershel, SPIE vol. 221, pp. 34-43 (1979). Such applications required relative motion between the mask and wafer in order to obtain an alignment measurement, which necessarily precluded alignment during exposure. Subsequent applications of the dark-field alignment concept were found in scanning exposure systems. See, e.g., U.S. Pat. No. 4,301,363; A. Suzuki, SPIE vol. 275, pp. 35-42 (1981). These systems scanned a laser beam across stationary alignment targets and collected scattered light for use in determining the alignment error. In such applications the mask and reticle are stationary during the alignment measurement process while the laser beam is actively scanned by a rotating mirror. This system is not configured for simultaneous exposure and alignment nor does it make use of mask and wafer scanning motions.

My contribution to the art allows the foregoing advantages to be incorporated into scanning photolithographic equipment.

SUMMARY OF THE INVENTION

In order to accomplish the desired results, the invention provides, in one form thereof, a new and improved alignment system for automatic mask-to-reticle alignment in a scanning exposure system.

A target, including two quadrilateral areas, is formed by known photolithographic processes on a wafer along with a circuit layer. An image of a slit mask is projected onto the wafer. The slit image has two orthogonal slits oriented in the same direction as the target. The wafer, hence the target, scans past the slit image. The edges of the target back-scatter radiation which is subsequently passed through a field stop and aperture stop, to pass only desired radiation, and then detected.

The slit images are made longer than the target bars so that light from a portion of the slit image is specularly reflected by the wafer. The reticle or mask scans through this reflected slit image and the light passes through reticle targets, which are narrow transmitting windows, and modulate the transmitted light as the reticle scans past the reflected slit image. The light which passes through the reticle target is then detected.

Thus, the positions of both the wafer and the reticle are known relative to the slit image. In this way information on the relative positions of the reticle and wafer and magnification can be extracted.

There has thus been outlined rather broadly the more important features of the invention in order that the detailed description thereof that follows may be better understood, and in order that the present contribution to the art may be better appreciated. There are, of course, additional features of the invention that will be described hereinafter and which will form the subject of the claims appended hereto. Those skilled in the art will appreciate that the conception on which the disclosure is based may readily be utilized as a basis for designing other structures for carrying out the several purposes of the invention. It is important, therefore, that the claims be regarded as including such equivalent structures as do not depart from the spirit and scope of the invention.

Specific embodiments of the invention have been chosen for purposes of illustration and description, and are shown in the accompanying drawings, forming a part of the specification.

DETAILED DESCRIPTION OF THE INVENTION

Figure 1:
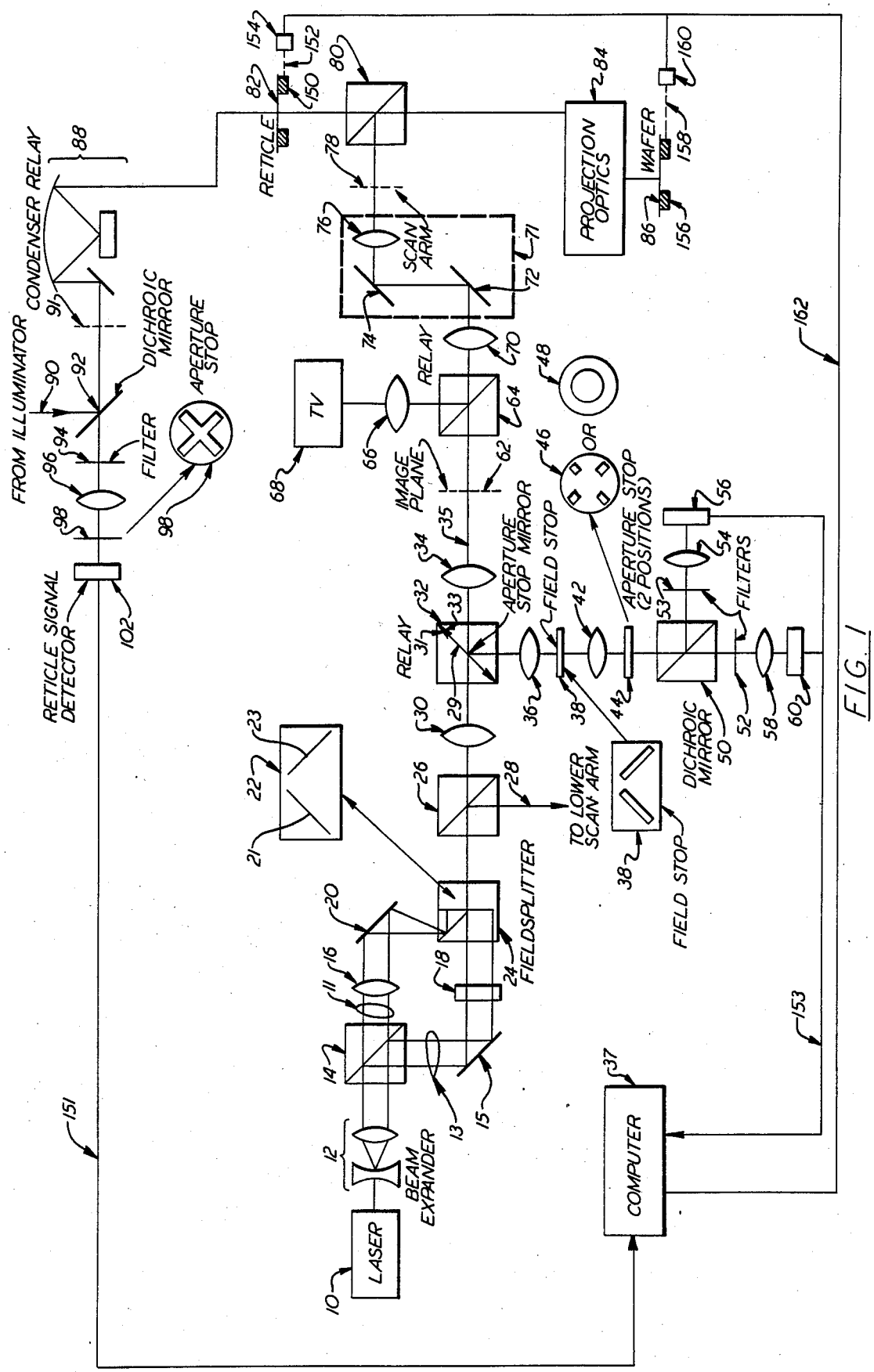
FIG. 1 is a schematic diagram showing an alignment system in accordance with the invention.

FIG. 1 is a schematic diagram showing an alignment system. A multi-wavelength laser 10, which is the source of alignment illumination, emits a small collimated beam of light which is enlarged in diameter by a beam expander 12. A beamsplitter 14 divides the beam into a first beam 11 and a second beam 13. A first cylindrical lens 16 is disposed in the path of the first beam 11 to focus the first beam 11 to a line focus. The first beam, emanating from cylindrical lens 16, is redirected by a mirror 20 to a fieldsplitter 24 where it comes to a focus on a slit mask 22. The location and function of the slit mask is explained below. The second beam 13 is redirected by a mirror 15 to a second cylindrical lens 18 which brings the second beam 13 to a line focus on slit mask 22 in the fieldsplitter 24.

The slit mask 22 is planar and has two slits 21 and 23 which are at right angles to each other and slightly displaced to avoid overlap. The slit mask 22 is so located and the fieldsplitter 24 so constructed that the line foci from cylindrical lenses 16 and 18 coincide with the slits 21 and 23, respectively. This illuminated slit mask 22 is in the object plane of an optical relay, shown in FIG. 1 as a pair of lenses 30 and 34, which forms an image at plane 62.

A beamsplitter 26 directs a portion of the light passing through slit mask 22 to a lower scan arm, not shown, via path 28. The purpose and operation of the lower scan arm will be explained hereinbelow.

A portion of the light passing through the slit mask 22 passes through the beamsplitter 26 into an aperture stop/mirror 32. The aperture stop/mirror 32 comprises a substrate 29, which is transparent to the light from laser 10, upon one side of which is disposed an annular opaque coating 31 and an annular reflective coating 33 on the other side. It should be noted that coatings 31 and 33 can be combined into one coating provided that such coating performs the functions hereindescribed and attributed to both coatings 31 and 33. The substrate 29 is disposed at an angle, e.g., 45° with respect to the optical axis 35 of the light passing through the substrate 29. In their preferred form, with the substrate 29 disposed at an angle, the annular reflective coating 33 and annular opaque coating are of an elliptical shape. The aperture stop/mirror 32 limits the numerical aperture of the relay, which consists of lenses 30 and 34, to a value less than that necessary to fill the numerical aperture of the projection optics 84. The numerical aperture of the relay, lenses 30 and 34, can be, for example, 70% of the NA of the projection optics 84.

The image in the image plane 62 of the relay lenses 30 and 34, is relayed to another image plane 78 by an optical system or relay consisting of lenses 70 and 76 and mirrors 72 and 74. The optical system of lenses 70 and 76 can be rotated about optical axis 35 so that the image plane 78 can be placed at any of a number of locations along an arc. This accommodates variable alignment target locations (sub-field heights).

The image at image plane 78 is redirected by a beamsplitter 80 and is relayed by projection optics 84 to the wafer 86.

The reticle 82 and wafer 86 move relative to the projection optics 84 during a scanning operation. This provides the exposure of a portion of the wafer 86 under reticle 82 by illumination light 90 which is condensed by a condenser relay 88 and passes through the reticle 82. The mechanism and procedure is not part of the present invention and will not be discussed further.

Figure 2:
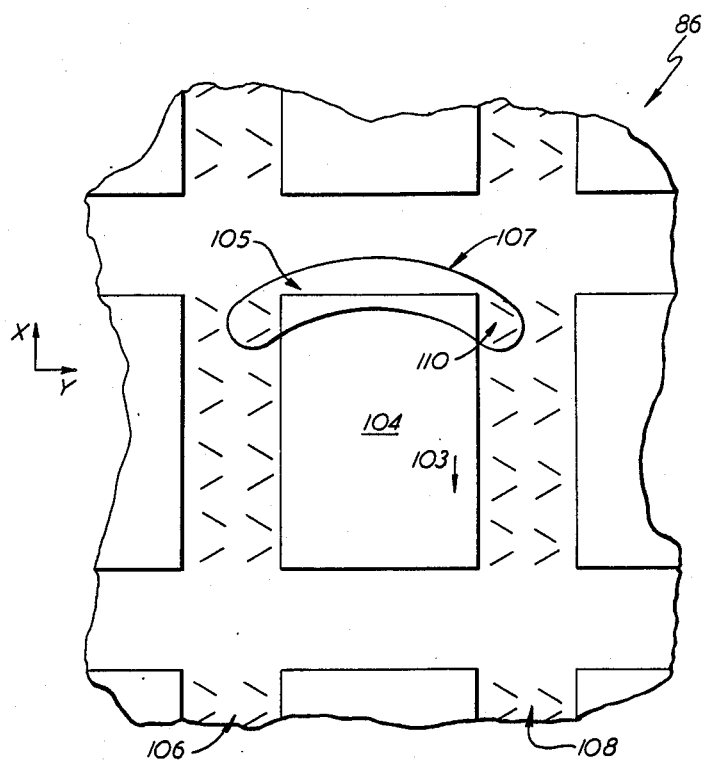
FIG. 2 is a plan view of a section of a wafer following exposure under a first level reticle.
Figure 4:
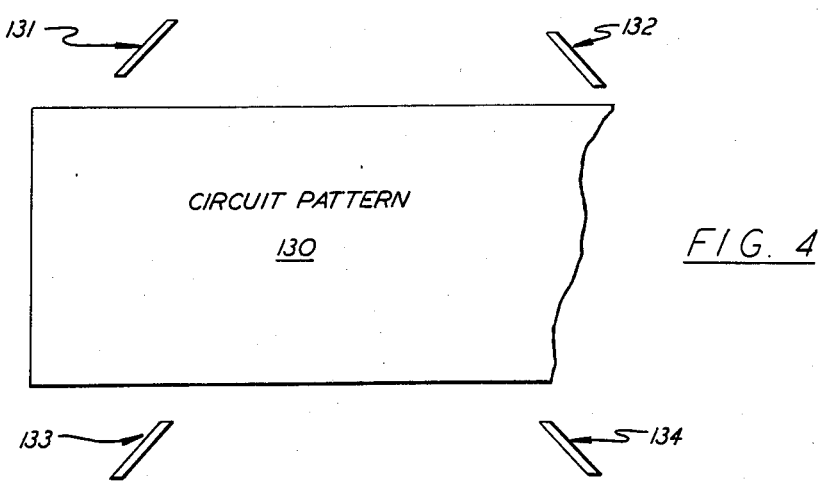
FIG. 4 is a plan view of a typical first level reticle.

At this point in the discussion reference should be had to FIG. 2 which is a plan view of a section of the wafer 86. On the surface of the wafer 86 are a plurality of subfields or circuit patterns, such as 104, which are the first layer of a circuit being built of many layers. Adjoining the circuit patterns 104 are scribe alleys 106, 108. In scribe alley 108 is a row of identical alignment targets 110 which have been established along with the first layer of the circuit patterns 104 through the photolithographic techniques previously described. The reticle 82 under which the wafer 86 is exposed to produce the alignment targets 110 is shown in FIG. 4 and described in reference thereto.

Figure 3:
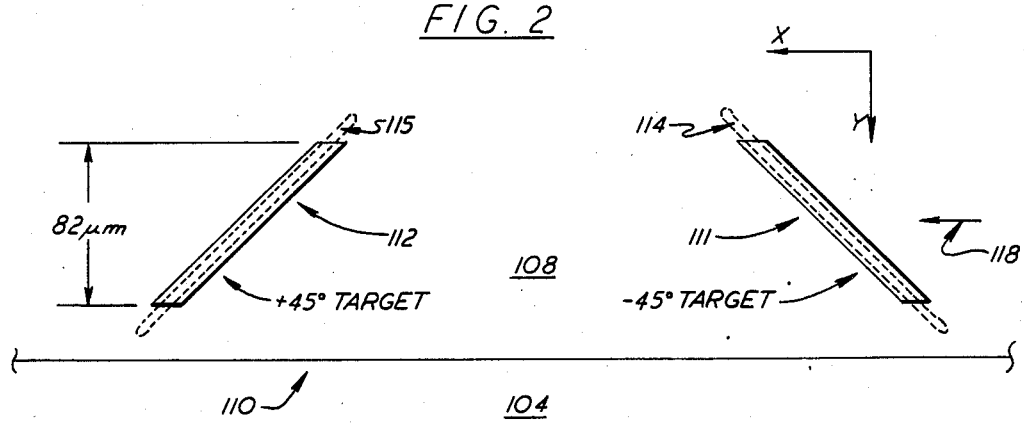
FIG. 3 is a plan view of a wafer target in a scribe alley of the wafer of FIG. 2.

FIG. 3 shows an enlarged plan view of one of the targets 110 of FIG. 2. The wafer targets 111 and 112 are a pair of quadrilateral areas, e.g. 116 μm long, that are, for example, about 7 μm wide and oriented at ±45° to the scan direction, as shown by an arrow 118. These dimensions, and those shown in FIG. 3 are for the purposes of example only. The wafer targets 111 and 112 extend above or below the surface of the scribe alley 108 a small distance. The wafer targets 111 and 112 are made long to reduce noise effects due to low scattered light levels and due to surface roughness of the wafer 86. The alignment image, projected onto the wafer in the manner described hereinabove, comprises two bars of light 114 and 115. The two bars of light 114 and 115 can be, for example, 1 μm wide. The wafer targets 111 and 112 are made wide compared to the width of the bars of light 114 and 115, respectively, projected on them. This ensures that the signal peaks generated by each target edge as the wafer target scans across the slit image are distinct. If the wafer target is too narrow, the peaks can overlap and make processing of the signal difficult and susceptible to errors from unequal peak heights.

Returning now to FIG. 1 the manner in which the scattered light from the edges of the wafer targets 111 and 112 of FIG. 3 is detected will be explained.

When the wafer targets 111 and 112 are scanned past the image of the slit mask 22, which is projected onto the wafer 86, the edges of the wafer targets 111 and 112 scatter light outside the cone of the slit image light.

Some of the scattered light lies within the numerical aperture (NA) of the projection optics 84 and, consequently, is collected by them. Thus at plane 78 an image, composed of reflected and scattered light, is formed. This light continues back through the relay of lenses 70 and 76, under the direction of mirrors 72 and 74, to beamsplitter 64. There, a portion of the beam is focused by a lens 66 onto a tv camera and display 68. This allows for visual inspection of the reflected and backscattered light from the wafer 86.

A portion of the beam is transmitted through the beamsplitter 64 to the aperture stop/mirror 32. The central portion of the substrate 29 transmits about 90% and reflects 10% of the light incident thereon. Thus, most of the light that was specularly reflected by the wafer passes through the central portion of the aperture stop/mirror 32. The scattered light is reflected at 45° incidence by the reflecting coating 33 on the substrate. In this way, the scattered light that lies outside the NA of the transparent central portion of the substrate 29 but inside the NA of the projection optics 84 is reflected by the reflecting coating 33. As disclosed above, the NA of the relay, lenses 30 and 34 or lenses 34 and 36, can be, for example, 70% of the NA of the projection optics 84. The factors constraining the choice of the exact proportion are two in number. First, the NA of the relay must be smaller than the NA of the projection optics 84 because for dark-field the collected backscattered light must be kept separate from illumination specularly reflected by the wafer 86. Second, if the NA of the relay is too low the width of the slit image is large, with a concomitant loss of resolution. A compromise of about 70% is suggested since then half the solid angle is available for dark-field collection. The area of the reflecting coating 33, therefore, is made equal to the area of the central portion of the substrate 29.

The light reflected by reflecting coating 33 is relayed by the relay of lenses 34 and 36 to be re-imaged at a field stop 38. The field stop 38, shown both in the system of FIG. 1 and in plane view for pedagogical purposes, has two slits therethrough oriented to each other as those in the slit mask 22. The slits in the field stop 38, however, are wider than those in the slit mask 22. This ensures that the image of the backscattered light from the wafer targets 111 and 112 is transmitted while at the same time stray light is rejected. The slits in the field stop 38 are shorter than those of the slit mask 22. This ensures that light scattered by the ends of the wafer targets 111 and 112, which could corrupt the signal, is not transmitted. The backscattered light that passes through the field stop 38 is imaged by a lens 42 onto an aperture stop 44. The stop can have one of two interchangeable forms, shown in plane view in FIG. 1 as the dark-field pattern 46 or the bright-field pattern 48. The dark-field pattern 46 of the aperture stop 44 transmits the scattered light reflected by the reflecting annulus 33 and blocks any light reflected by the central portion of the substrate 29. The optional bright-field pattern 48 blocks the scattered light from the reflecting annulus 33 and transmits the light reflected by the central portion of the substrate 29. The bright-field pattern 48 is selected when bright-field detection is desired as explained hereinbelow.

After the aperture stop the light is separated by wavelength. For simplicity, only two wavelengths will be considered here; the separation can then be accomplished by, for example, a dichroic mirror 50. Light of each wavelength is detected by a detector 56 and 60 after passing through a filter 53 and 52, respectively, and being focused by a lens 54 and 58, respectively. Each of the filters, 53 and 52, serves to block all light except for the wavelength of interest, that is, one of the wavelengths produced by the laser 10. In this way the backscattered light can be analyzed without interference by exposure radiation 90. The detectors 56 and 60 each produce signals like those shown in the top waveform of FIG. 7. These signals are transmitted, via a line 153, to a computer 37 where they are analyzed in a manner explained hereinbelow in reference to FIG. 7.

To this point I have discussed the manner in which the wafer 86 is illuminated by light from the laser 10 and the manner in which that light is reflected or backscattered, collected, separated and detected. The goal of the system of FIG. 1 is to align the wafer 86 to the reticle 82, consequently a reference point on the reticle 82 must be established and registered with the reference point, wafer targets 111 and 112, on the wafer 86.

Some of the alignment image comprising bars of light 114 and 115 from the slit mask 22 projected on the wafer 86, as shown in FIG. 3, always misses the wafer target 111 or 112 since the length of the bars of light 114 and 115, as projected on the wafer 86, are greater than the length of the wafer targets 111 and 112, respectively. Some of this light is thus uncorrupted by the wafer targets 111 and 112, and is reflected back through the projection optics 84 and passes through the beamsplitter 80 to the reticle 82. This reflected light is reimaged, by the projection optics 84, onto the reticle 82.

FIG. 4 shows a plan view of a section of a typical first level reticle 82 of FIG. 1. Shown is a circuit pattern 130 under which the circuit pattern 104 of FIG. 2 is exposed. The apertures 131 and 132 pass the exposing light 90 to expose the alignment target 110 of FIG. 2. Likewise, apertures 133 and 134 are useful in exposing an alignment target 105, also shown in FIG. 2.

Figure 5:
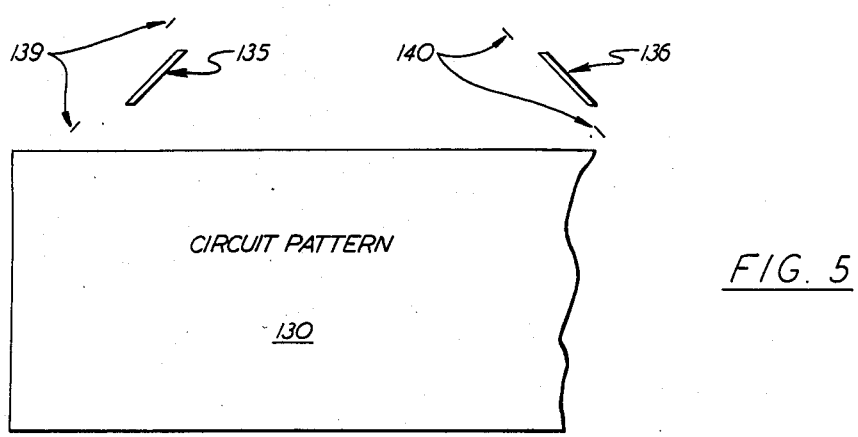
FIG. 5 is a plan view of a typical second level reticle.
Figure 6:
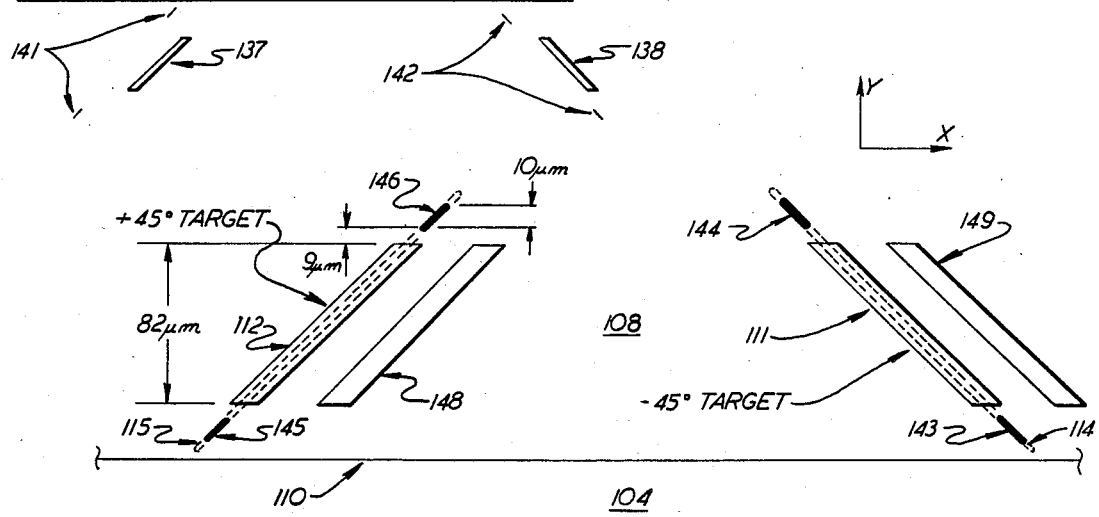
FIG. 6 is a plan view of the wafer target of FIG. 3 after exposure of the second circuit level.

FIG. 5 shows a plan view of a section of a typical second level reticle 82 useful in the apparatus of FIG. 1. In addition to the apertures 135-138 for exposing the second level wafer targets, FIG. 5 also illustrates the first level reticle targets 139-142. The reticle targets 139-142 comprise two reticle target slits each. The reticle target slits are narrow transmitting windows and modulate the light as the reticle 82 scans across the light reflected by the wafer 86. This light is re-imaged by a condenser relay 88 at a plane 91. The light then passes through a dichroic mirror 92. The dichroic mirror 92 directs illumination light 90 into the optical system of FIG. 1 to expose the wafer 86. Such exposure illumination 90 does not form a part of the present invention. The exposure illumination 90 does, however, provide light that passes through the reticle slits 139-142 in the reticle 82. This light is imaged on the wafer 86 as reticle slit images 143-146 shown in FIG. 6. The reticle slit images 143-146 consist of narrow (1 $\mu$m at the wafer) line segments which straddle the wafer targets 111 and 112, as shown in FIG. 6 when the reticle 82 is properly aligned to the wafer 86. The reticle slit images 143-146 are made to straddle the wafer target to reduce errors caused by imperfect orientation of the slit mask 22 with respect to the same direction, shown by arrow 118 in FIG. 6. It should be noted that the dimensions shown in FIG. 6 are for the purpose of example only.

The image 114 and 115 of the slit mask 22 on the wafer 86 overlays the area described by the reticle slit images 143-146. It is light from the laser 10, reflected from the area of the slit images 143-146, that is modulated by the reticle slits 139-142. The condition shown in FIG. 6, with the slit images 143 and 144 co-linear with wafer target 111 and slit images 145 and 146 co-linear with wafer target 112 represents perfect wafer-to-reticle alignment. Also shown in FIG. 6 are the next level wafer targets 148 and 149 as printed by radiation passing through apertures 135 and 136.

The light that passes through the dichroic mirror 92 is focused onto a detector 102 by a lens 96. A filter 94 is provided to filter out all but the wavelength of interest. That is, one of the wavelengths produced by the laser 10. A dichroic mirror, similar in construction and use to dichroic mirror 50, could also be provided to allow for viewing multiple wavelengths. An optional aperture stop 98, shown in the optical system and in plan view in FIG. 1, can be employed to further block stray light in the manner described hereinabove in reference to the aperture stop 44. Thus, the detector 102 receives the light signal as modulated by the reticle slits 139–142. The signal generated by the detector 102 in response to the light thereon is shown as the lower waveform in FIG. 7. It is transmitted, via a line 151, to the computer 37 where it is processed in the manner described hereinbelow in reference to FIG. 7.

Items 91–102 are applicable to just one field position on the wafer 86, as are items 30–78 and 36–60. The beamsplitter 26 sends light from the laser 10 to another similar set of optics for detection of a row of targets, such as 105 in FIG. 2, at another field location on the wafer 86.

Figure 7:
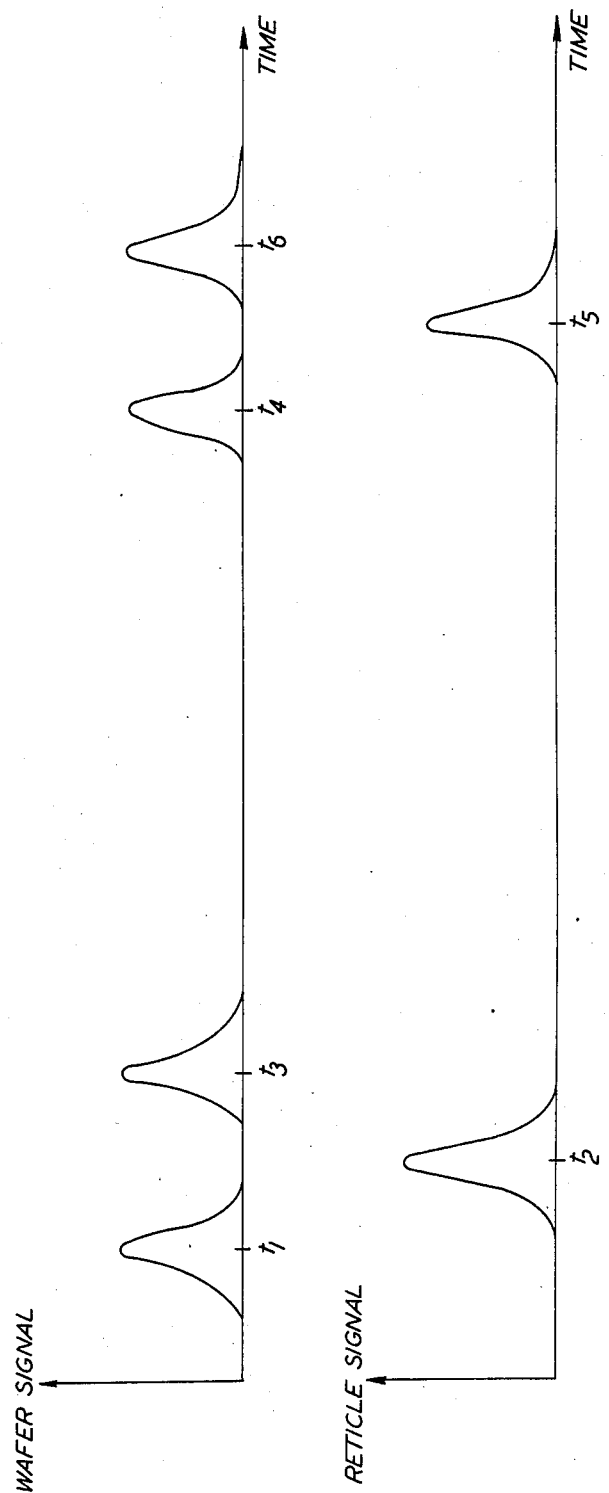
FIG. 7 is a graphical representation of the signals generated by the apparatus of FIG. 1 upon scanning the target of FIG. 3.

The alignment light reflected from the area of the reticle slit images 143–146, when properly aligned with the wafer targets 111 and 112 gives rise to signals as shown in FIG. 7. Alignment error information can be extracted from the comparison of $t_3-t_2$ with $t_2-t_1$ for $-45°$ targets and $t_6-t_5$ with $t_5-t_4$ for $-45°$ targets.

The separation between the slit images 114 and 115 is made different from the separation between wafer targets 111 and 112 to ensure that the signal peaks from the $-45°$ bar, at $t_1$ and $t_3$, are easily distinguished from those of the $+45°$ bar, at $t_4$ and $t_6$. Furthermore the slit images 114 and 115 are longer than the distance spanned by the reticle slit images to ensure that the entire reticle target is illuminated.

By combining the signals of FIG. 7 with similar signals derived from the optics and sensing apparatus in the lower scan arm 28 the X and Y deviation of the reticle from the wafer can be determined as can magnification errors and rotation of the reticle relative to the wafer.

The magnitude of the X and Y deviation of the reticle from the wafer and the magnification error is computed in the computer 37 through techniques known in the art. If a correction is needed a correction signal is sent from the computer 37, via a line 162, to correction actuators 160 and 154. A wafer actuator 160 and a reticle actuator 154 correct the relative positions of the wafer 86 and reticle 82, respectively, through mechanical linkages 158 and 152, respectively, acting on a wafer supporting platform 156 and a reticle supporting platform 150 respectively.

It should be noted that a plurality of targets, 110 or 111, may be fabricated on a single level of a semi-conductor product having many levels. In this way the wafer-to-reticle alignment may be adjusted continuously as the wafer 86 and reticle 82 are scanned relative to the alignment light from the laser 10 and the exposure illumination 107 scans in the direction shown by an arrow 103 in FIG. 2.

Figure 8:
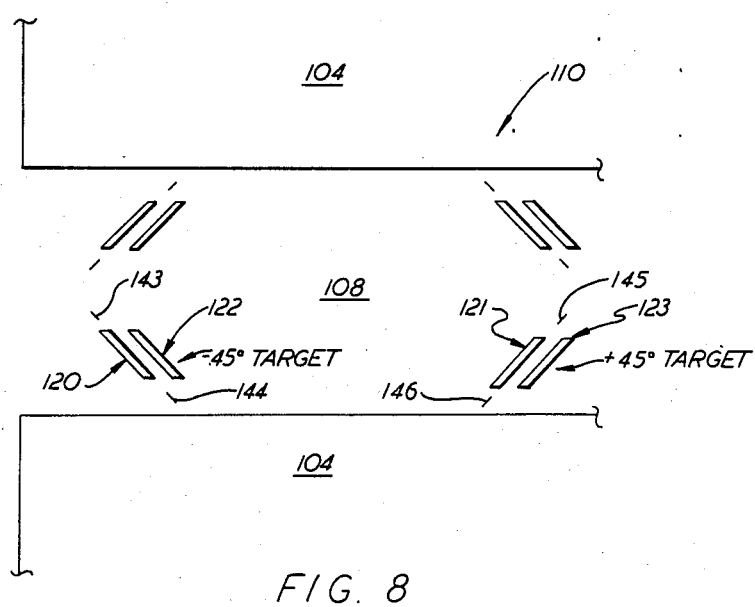
FIG. 8 is another form of a wafer target in a scribe alley of the wafer of FIG. 2.

FIG. 8 shows another form of the alignment marks of FIG. 3 wherein there are two each of the $-45°$ targets and of the $+45°$ targets. In this way one level can be aligned to a reticle through said wafer alignment marks 120 and 121. After exposure of the wafer 86 the reticle images 143–146 are printed on the scribe alley 108 co-linear with the wafer marks 120 and 121, as shown. No reticle marks are printed associated with wafer targets 122 or 123. Accordingly wafer targets 122 and 123 can be used later to align a subsequent circuit level to the one that was printed along with the wafer targets 122 and 123. In this way cumulative alignment errors can be avoided as circuit patterns are built up layer by layer.

The system as described above utilizes reverse-dark-field wafer target detection and bright field reticle target detection. This system can be switched to reverse-bright-field wafer detection by a change of aperture stop 44 from the dark-field pattern 46 to the bright field pattern 48. The bright field patterns 48 blocks the scattered light and transmits the specularly reflected light from the wafer target 110, shown in FIG. 2. The specularly reflected light has been greatly attenuated due to the low, e.g. 10% reflectivity of the central portion of the substrate 29, but the bright-field signal is generally stronger than the dark-field signal. This mode is useful in some cases when the reverse-dark-field wafer target signal is too weak or noisy.

Both reticle and wafer target detection are performed separately and can be done at multiple wavelengths. If the signals at one wavelength are too small, they are ignored and signals at another wavelength are used. If more than one wavelength gives strong signals they can be averaged to yield more accurate data.

It can thus be seen that the present invention does indeed provide a new and improved reverse dark-field reticle-to-wafer alignment system. This system aligns the reticle to the wafer during the scanning exposure process accurately and does so while the reticle and wafer are moving relative to the alignment illumination. Accurate wafer-to-reticle alignment is achieved by making use of the scanning motion required for scanning exposure, and without active scanning of the illumination light. In addition, the alignment can be accomplished even if there is relative motion between reticle and wafer as long as there is no relative motion between the wafer image and the reticle image, such as is the case in a scanning projection system with magnification other than unity.

Although specific embodiments have been illustrated and described, it will be obvious to those skilled in the art that various modifications may be made without departing from the spirit and scope of the invention which is to be limited solely by the appended claims.

What is claimed is:

1. An alignment apparatus comprising:
    a source of alignment illumination;
    a wafer having a wafer target thereon;
    a reticle having a reticle target therethrough;
    imaging means to form an alignment image of said alignment illumination on said wafer, said alignment image having a predetermined geometry;
    scanning means to move said wafer and said reticle relative to said alignment image;
    said alignment image having a linear extent longer than said wafer target so that a portion of said alignment image is reflected by said wafer;

reimaging means to reimage said portion of said alignment image, being reflected from said wafer, onto said reticle target;

collecting means to collect light from said alignment image backscattered from said wafer target as said wafer target is scanned past said alignment image;

first detecting means to detect said backscattered light; and second detecting means to detect said portion of said alignment image reflected by said wafer and passing through said reticle target.

2. An alignment apparatus as claimed in claim 1 which further comprises:

computer means;

said first detecting means providing first signals to said computer means proportional to light incident thereon;

said second detecting means providing second signals to said computer means proportional to light incident thereon; and said computer means producing error signals proportional to alignment errors, magnification errors and rotational errors between said reticle and said wafer based on said first signals and said second signals.

3. An alignment apparatus as claimed in claim 2 which further comprises:

a wafer supporting platform;

a reticle supporting platform;

a wafer actuator operably connected to said wafer supporting platform;

a reticle actuator operably connected to said reticle supporting platform; and said computer means being operably connected to said wafer actuator and said reticle actuator so as to provide said alignment error signals to cause said wafer actuator and said reticle actuator to move said wafer and said reticle relative to each other when alignment, magnification or rotational errors exist.

4. An alignment apparatus as claimed in claim 1 wherein said wafer target comprises a first quadrilateral area and a second quadrilateral area disposed at +45° and −45°, respectively, to the scan direction.

5. An alignment apparatus as claimed in claim 4 wherein said reticle target comprises windows through said reticle.

6. An alignment apparatus as claimed in claim 5 which further comprises:

a first pair of said windows and a second pair of said windows corresponding to said first quadrilateral area and said second quadrilateral area, respectively;

said first pair of said windows being spatially separated and colinear such that an image of said first pair of said windows, projected onto said wafer, is parallel to said first quadrilateral area and has a linear extent longer than said first quadrilateral area; and said second pair of said windows being spatially separated and colinear such that an image of said second pair of said windows, projected onto said wafer is parallel to said second quadrilatera area and has a linear extent longer than said second quadrilateral area.

7. An alignment apparatus as claimed in claim 4 wherein said alignment image comprises:

a first bar of light parallel to said first quadrilateral area;

a second bar of light parallel to said second quadrilateral area; and said first and second bar of light spaced apart a distance unequal to that between said first and second quadrilateral areas.

8. An alignment apparatus as claimed in claim 1 wherein a plurality of wafer targets are provided along said direction of scan.

9. An alignment apparatus as claimed in claim 4 wherein said wafer targets comprise a plurality of first quadrilateral areas and a like plurality of second quadrilateral areas.

10. An alignment apparatus as claimed in claim 4 wherein said wafer target protrudes above said wafer.

11. An alignment apparatus as claimed in claim 4 wherein said wafer target extends below the surface of the wafer.

12. An alignment apparatus as claimed in claim 7 wherein the width of said first bar of light and said second bar of light are less than the width of said first and second quadrilateral areas, respectively.

13. An alignment apparatus as claimed in claim 7 wherein said first bar of light and said second bar of light are longer than said first quadrilateral area and said second quadrilateral area, respectively, by a predetermined distance.

14. An alignment apparatus as claimed in claim 13 wherein the portions of said first bar of light and said second bar of light incident on said wafer along said predetermined distance are reimaged onto said reticle target by said reimaging means.

15. An alignment apparatus as claimed in claim 1 which further comprises:

a dichroic mirror disposed between said reticle and said second detecting means which passes said alignment illumination; and a filter disposed between said dichroic mirror and said second detecting means which passes only said alignment illumination.

16. An alignment apparatus as claimed in claim 1 wherein said alignment illumination comprises a plurality of predetermined wavelengths.

17. An alignment apparatus as claimed in claim 16 which further comprises:

a field stop disposed between said beamsplitter means and said first detecting means, said field stop transmitting said alignment image backscattered from said wafer target and rejecting stray light; and an aperture stop disposed between said field stop and said first detecting means.

18. An alignment apparatus as claimed in claim 1 which further comprises:

beamsplitter means disposed between said collecting means and said first detecting means;

said beamsplitter means having a substantially transparent central portion circumscribed by a reflecting annulus; and said alignment image backscattered from said wafer target being inside the numerical aperture of said collecting means and said reflecting annulus but outside the numerical aperture of said substantially transparent central portion.

19. An alignment apparatus as claimed in claim 17 wherein said aperture stop passes said alignment image backscattered from said wafer target which passes through said field stop.

20. An alignment apparatus as claimed in claim 17 wherein said aperture stop passes said alignment image specularly reflected from said wafer target.

21. An alignment apparatus as claimed in claim 18 which further comprises:
   second dichroic mirror disposed between said aperture stop and said first detecting means;
   said second dichroic mirror producing a first beam of one wavelength and a second beam of another wavelength;
   said first beam passing through a first filter, corresponding to a first of said plurality of predetermined wavelengths;
   said second beam corresponding to a second of said plurality of predetermined wavelengths;
   a first detector disposed to detect said first beam passing through said first filter; and
   a second detector disposed to detect said second beam passing through said second detector.

22. A method for aligning a wafer to a reticle comprising:
   providing a wafer having a wafer target thereon;
   providing a reticle having a reticle target therethrough;
   illuminating said wafer target with an alignment image having a predetermined geometry;
   scanning said wafer and said reticle relative to said alignment image;
   reimaging a portion of said alignment image, which extends beyond said wafer target, onto said reticle target;
   collecting light backscattered from said wafer target as said wafer target is scanned past said alignment image;
   detecting said backscattered light and providing a first signal proportional thereto;
   detecting the portion of said alignment image passing through said reticle target and providing a second signal proportional thereto;
   computing alignment errors, magnification errors and rotational errors between said wafer and said reticle based on said first signal and said second signal.

* * * * *